United States Patent [19]

Sayama et al.

[11] Patent Number: 5,744,845
[45] Date of Patent: Apr. 28, 1998

[54] COMPLEMENTARY MOS FIELD EFFECT TRANSISTOR WITH TUNNEL EFFECT MEANS

[75] Inventors: Hirokazu Sayama; Takashi Kuroi, both of Hyogo, Japan

[73] Assignee: Mitsubishi Denki Kabushiki Kaisha, Tokyo, Japan

[21] Appl. No.: 800,147

[22] Filed: Feb. 13, 1997

Related U.S. Application Data

[63] Continuation of Ser. No. 605,936, Feb. 23, 1996, abandoned.

[30] Foreign Application Priority Data

Sep. 21, 1995 [JP] Japan ................... 7-242955

[51] Int. Cl.⁶ ........................... H01L 29/76; H01L 29/94
[52] U.S. Cl. ........................................ 257/371; 257/412
[58] Field of Search ................................. 257/369, 371, 257/412, 413, 761, 764, 768, 769

[56] References Cited

U.S. PATENT DOCUMENTS

| | | | |
|---|---|---|---|
| 4,599,789 | 7/1986 | Gasner | 257/371 |
| 4,740,481 | 4/1988 | Wilson et al. | 257/412 |
| 5,023,679 | 6/1991 | Shibata | 257/412 |
| 5,200,630 | 4/1993 | Nakamura et al. | 257/66 |

FOREIGN PATENT DOCUMENTS

| | | |
|---|---|---|
| 19542411 A1 | 5/1996 | Germany . |
| 2155273 | 6/1990 | Japan .................. 257/413 |

OTHER PUBLICATIONS

IBM technical disclosure Bulletin;"Underlay for Polycide Process", vol. 28, No. 9, Feb. 1986.

"W/WNx/Poly-Si gate . . . ", Kasai et al; 1994 IEEE pp. 497–500.

IBM TDB, vol. 27, No. 11, 1985, pp. 6652–6655 no month.

IEEE Trans. on Electron Dev., vol. 40, No. 9, 1993, pp. 1675–1681 no month.

W/WNx/Poly-Si Gate Technology for Future High Speed Deep Submicron CMOS LSIs, by K. Kasai et al., 1994 IEEE, pp. 497–500 no month.

*Primary Examiner*—Wael Fahmy
*Attorney, Agent, or Firm*—Lowe, Price, LeBlanc & Becker

[57] ABSTRACT

In a complementary MOS field effect transistor having a dual gate electrode structure, which is improved so that an element property can be enhanced, a first gate electrode of an n channel MOSFET includes a first barrier film, and a second gate electrode of a p channel MOSFET includes a second barrier film. The first barrier film has a sufficiently small thickness so that a potential can be transmitted from a first conductive film to a first polycrystalline silicon film by means of a tunnel effect. The second barrier film has a sufficiently small thickness so that a potential can be transmitted from a second conductive film to a second silicon film by means of a tunnel effect.

4 Claims, 11 Drawing Sheets

COMPLEMENTARY MOS FIELD EFFECT TRANSISTOR WITH TUNNEL EFFECT MEANS

This application is a continuation of application Ser. No. 08/605,936 filed Feb. 23, 1996, now abandoned.

BACKGROUND OF THE INVENTION

1. Field of the Invention

The present invention generally relates to a complementary MOS (Metal Oxide Semiconductor) field effect transistor, and more particularly, to a complementary MOS field effect transistor improved so that an element property can be enhanced. The present invention also relates to a method of manufacturing such a complementary MOS field effect transistor.

2. Description of the Background Art

In manufacturing a semiconductor circuit, reduction in resistance of a gate electrode and an interconnection layer of a transistor is required in order to prevent operation delay due to that resistance. For achievement of this reduction in resistance, a stacked film of a phosphorus-doped polycrystalline silicon film and a metal silicide film is generally used for a gate electrode and an interconnection layer.

In addition, when a complementary MOS field effect transistor (hereinafter simply referred to as CMOS) shown in FIG. 24 is formed, it is effective to use a polycrystalline silicon film 21 to which p-type impurities have been doped for a gate electrode in order to suppress a short channel effect of a p channel MOS field effect transistor 20. In this case, however, a polycrystalline silicon film 23 to which n-type impurities have been doped is used for a gate electrode of an n channel MOSFET 22. More specifically, in forming a CMOS, the CMOS is required to have a dual gate structure with gate electrodes of two types.

The term "dual gate structure" herein is the opposite of the term "single gate structure". If dopants of the same kind are implanted into a first gate electrode and a second gate electrode in forming a CMOS, it is called a CMOS having a single gate structure, and if dopants of different kinds are implanted into a first gate electrode and a second gate electrode, it is called a CMOS having a dual gate structure.

In the dual gate structure, a metal silicide or metal film 24 must be formed on both polycrystalline silicon films 21 and 23 in order to connect polycrystalline silicon films 21 and 23 of two types to each other, to which n-type and p-type impurities have been doped, respectively. If n-type impurity-implanted polycrystalline silicon film 23 and p-type impurity-implanted polycrystalline silicon film 21 are connected to each other, for example, by means of an n-type impurity-implanted polycrystalline silicon interconnection without forming metal silicide film or metal film 24, current will not flow between p-type polycrystalline silicon film 21 and n-type polycrystalline silicon interconnection due to a pn junction.

A method of manufacturing a conventional CMOS having a dual gate electrode structure will now be described.

Referring to FIG. 25, an element isolation oxide film 2 is formed at a surface of a semiconductor substrate, a silicon substrate 1, for example. An n well 8 is formed in a region where a p channel MOSFET (hereinafter simply referred to as pMOS) is to be formed, and a p well 9 is formed in a region where an n channel MOSFET (hereinafter simply referred to as nMOS) is to be formed. A gate insulating layer 3 which will be a gate insulating film and a polycrystalline silicon film 4 are formed on silicon substrate 1 in this order.

Referring to FIG. 26, a resist film 26 which covers polycrystalline silicon film 4 except a region where an nMOS to be formed is formed. Then, p-type impurities are doped by implantation of B ions into polycrystalline silicon film 4, using resist film 26 as a mask. Resist 26 is then removed.

Referring to FIG. 27, a resist film 28 which covers polycrystalline silicon film 4 except a region where a pMOS is to be formed is formed.

Then, n-type impurities are doped by implantation of As ions into polycrystalline silicon film 4, using resist film 28 as a mask. Resist 28 is then removed.

Referring to FIG. 28, a tungsten silicide layer 5 is formed on polycrystalline silicon film 4 by sputtering.

Referring to FIG. 29, a resist film 29 is formed in both regions where first and second gate electrodes are formed, respectively, on tungsten silicide layer 5. Referring to FIGS. 29 and 30, tungsten silicide layer 5, polycrystalline silicon film 4 and gate insulating layer 3 are etched using resist film 29 as a mask to form a first gate electrode 30 and a second gate electrode 31. Referring to FIG. 31, the resist film 29 is then removed.

Referring to FIG. 32, a p-type source/drain region 7a is formed by means of techniques of photolithography and ion implantation.

Similarly, an n-type source/drain region 7b is formed by implantation of As ions into a surface of silicon substrate 1 by means of techniques of photolithography and ion implantation.

Thus, a CMOS field effect transistor having a dual gate is completed.

A conventional CMOS has the following problems.

First, referring to FIG. 32, dopants in first and second polycrystalline silicon films 36 and 37 of first and second gate electrodes 30 and 31 are absorbed up into first and second tungsten silicide films 38 and 39, respectively. If dopant concentrations in polycrystalline silicon films 36 and 37 of gate electrodes 30 and 31 are reduced, depletion layers are formed at interfaces between gate electrodes 30 and 31 and gate insulating film 40, respectively, and gate capacitance is reduced. Consequently, a threshold voltage is increased and current driving ability is reduced, resulting in delay of a circuit operation.

Second, referring to FIG. 28, boron in a p-type impurity-doped polycrystalline silicon film 4a is diffused into an n-type impurity-doped polycrystalline silicon film 4b through tungsten silicide layer 5. At the same time, arsenic in n-type impurity-doped polycrystalline silicon film 4b is diffused into p-type impurity-doped polycrystalline silicon film 4a through tungsten silicide layer 5. As a result, a work function of a gate electrode and a threshold voltage of a transistor change, resulting in reduction in current driving ability.

SUMMARY OF THE INVENTION

The present invention is made to solve such problems as described above, and it is an object of the present invention to provide a complementary MOS field effect transistor having a dual gate structure, which is improved so that a work function of a gate electrode will not change.

It is another object of the present invention to provide a complementary MOS field effect transistor having a dual gate structure, which is improved so that a threshold voltage of a transistor will not change.

It is a further object of the present invention to provide a complementary MOS field effect transistor having a dual gate structure, which is improved so that current driving ability will not be reduced.

It is a still further object of the present invention to provide a method of manufacturing such a complementary MOS field effect transistor having a dual gate structure.

A complementary MOS field effect transistor in accordance with a first aspect of the present invention includes a semiconductor substrate. An n well and a p well are formed at a surface of the semiconductor substrate. An n channel MOSFET having a first gate electrode is formed in the p well. A p channel MOSFET having a second gate electrode is formed in the n well. The first gate electrode includes a first silicon film which is formed on the p well with a gate insulating film therebetween and to which impurities of a first conductivity type have been implanted; a first barrier film formed on the first silicon film; and a first conductive film which is formed on the first barrier film and is made of metal or metal silicide. The second gate electrode includes a second silicon film which is formed on the n well with a gate insulating film therebetween and to which impurities of a second conductivity type have been implanted; a second barrier film formed on the second silicide film; and a second conductive film which is formed on the second barrier film and is made of metal or metal silicide. The first barrier film is made to be sufficiently thin so that a potential can be transmitted from the first conductive film to the first silicon film by means of a tunnel effect. The second barrier film is made to be sufficiently thin so that a potential can be transmitted from the second conductive film to the second silicon film by means of a tunnel effect.

A complementary MOS field effect transistor in accordance with a second aspect of the present invention includes a semiconductor substrate. An n well and a p well are formed at a surface of the semiconductor substrate. An n channel MOSFET having a first gate electrode is formed in the p well. A p channel MOSFET having a second gate electrode is formed in the n well. The first gate electrode includes a first silicon film which is formed on the p well with a gate insulating film therebetween and to which impurities of a first conductivity type have been implanted; a first barrier film of metal silicide formed on the first silicon film; and a first conductive film of metal or metal silicide formed on the first barrier film. The second gate electrode includes a second silicon film which is formed on the n well with a gate insulating film therebetween and to which impurities of a second conductivity type have been implanted; a second barrier film of metal silicide formed on the second silicon film; and a second conductive film of metal or metal silicide formed on the second barrier film.

A complementary MOS field effect transistor in accordance with a third aspect of the present invention includes a semiconductor substrate. An n well and a p well are formed at a surface of the semiconductor substrate. An n channel MOSFET having a first gate electrode is formed in the p well. A p channel MOSFET having a second gate electrode is formed in the n well. The first gate electrode includes a first silicon film which is formed on the p well with a gate insulating film therebetween and to which impurities of a first conductivity type have been implanted; a first barrier film of metal nitride formed on the first silicon film; and a first conductive film of metal or metal silicide formed on the first barrier film. The second gate electrode includes a second silicon film which is formed on the n well with a gate insulating film therebetween and to which impurities of a second conductivity type have been implanted; a second barrier film of metal nitride formed on the second silicon film; and a second conductive film of metal or metal silicide formed on the second barrier film.

A method of manufacturing a complementary MOS field effect transistor in accordance with a fourth aspect of the present invention relates a method of manufacturing a complementary MOSFET having an n channel MOSFET formed in a p well and a p channel MOSFET formed in an n well. An n well and a p well are formed at a surface of a semiconductor substrate. A gate insulating layer is formed on the semiconductor substrate. A non-monocrystalline silicon film is formed on the semiconductor substrate with the gate insulating layer therebetween. Impurities of a first conductivity type are implanted into a region where a first gate electrode of the p channel MOSFET is to be formed in the non-monocrystalline silicon film. Impurities of a second conductivity type are implanted into a region where a second gate electrode of the n channel MOSFET is to be formed in the non-monocrystalline silicon film. A barrier layer is formed on the non-monocrystalline silicon film. A conductor layer of metal silicide or metal is formed on the barrier layer. The non-monocrystalline silicon film, the barrier layer and the conductor layer are patterned, so that a first gate electrode in which a first silicon film to which impurities of a first conductivity type have been implanted, a first barrier film and a first conductive layer are stacked is formed on the n well, and a second gate electrode in which a second silicon film to which impurities of a second conductivity type have been implanted, a second barrier film and a second conductive film are stacked is formed on the p well. The thickness of the barrier layer is selected to be sufficiently small so that a potential can be transmitted from the first conductive film to the first silicon film by means of a tunnel effect.

A method of manufacturing a complementary MOS field effect transistor in accordance with a fifth aspect of the present invention relates to a method of manufacturing a complementary MOS field effect transistor having an n channel MOSFET formed in a p well and a p channel MOSFET formed in an n well. First, an n well and a p well are formed at a surface of a semiconductor substrate. A gate insulating layer is formed on the semiconductor substrate. A non-monocrystalline silicon film is formed on the semiconductor substrate with the gate insulating layer therebetween. Impurities of a first conductivity type are implanted into a region where a first gate electrode of the p channel MOSFET is to be formed in the non-monocrystalline silicon film. Impurities of a second conductivity type are implanted into a region where a second gate electrode of the n channel MOSFET is to be formed in the non-monocrystalline silicon film. A metal layer is formed on the non-monocrystalline silicon film by a sputtering method. A conductor layer of metal silicide or metal is formed on the metal layer. The metal layer is changed into a metal silicide layer. The non-monocrystalline silicon film, the metal silicide layer and the conductor layer are patterned, so that a first gate electrode in which a first silicon film to which the impurities of a first conductivity type have been implanted, a first metal silicide film and a first conductive layer are stacked is formed on the n well, and a second gate electrode in which a second silicon film to which the impurities of a second conductivity type have been implanted, a second metal silicide film and a second conductive film are stacked is formed on the p well.

A method of manufacturing a complementary MOS field effect transistor in accordance with a fifth aspect of the present invention relates to a method of manufacturing a complementary MOS field effect transistor having an n channel MOSFET formed in a p well and a p channel MOSFET formed in an n well. First, an n well and a p well are formed at a surface of a semiconductor substrate. A gate insulating layer is formed on the semiconductor substrate. A non-monocrystalline silicon film is formed on the semiconductor substrate with the gate insulating layer therebetween. Impurities of a first conductivity type are implanted into a region where a first gate electrode of the p channel MOSFET is to be formed in the non-monocrystalline silicon film. Impurities of a second conductivity type are implanted into a region where a second gate electrode of the n channel MOSFET is to be formed in the non-monocrystalline silicon film. A metal nitride layer is formed on the non-monocrystalline silicon film by a sputtering method. A conductor layer of metal silicide or metal is formed on the metal nitride layer. The non-monocrystalline silicon film, the metal nitride layer and the conductor layer are patterned, so that a first gate electrode in which a first silicon film to which the impurities of a first conductivity type have been implanted, a first metal nitride film and a first conductive film are stacked is formed on the n well, and a second gate electrode in which a second silicon oxide film to which the impurities of a second conductivity type have been implanted, a second metal nitride film and a second conductive film are stacked is formed on the p well.

A method of manufacturing a complementary MOS field effect transistor in accordance with a seventh aspect of the present invention relates to a method of manufacturing a complementary MOS field effect transistor having an n channel MOSFET formed in a p well and a p channel MOSFET formed in an n well. An n well and a p well are formed at a surface of a semiconductor substrate. A gate insulating layer is formed on the semiconductor substrate. A non-monocrystalline silicon film is formed on the semiconductor substrate with the gate insulating layer therebetween. Impurities of a first conductivity type are implanted into a region where a first gate electrode of the p channel MOSFET is to be formed in the non-monocrystalline silicon film. Impurities of a second conductivity type are implanted into a region where a second gate electrode of the n channel MOSFET is to be formed in the non-monocrystalline silicon film. A metal layer is formed on the non-monocrystalline silicon film by a sputtering method. The metal layer is changed into a metal nitride layer. A conductor layer of metal silicide or metal is formed on the metal nitride layer. The non-monocrystalline silicon film, the metal nitride film and the conductor layer are patterned, so that a first gate electrode in which a first silicon film to which the impurities of a first conductivity type have been implanted, a first metal nitride film and a first conductive film are stacked is formed on the n well, and a second gate electrode in which a second silicon film to which the impurities of a second conductivity type have been implanted, a second metal nitride film and a second conductive film are stacked is formed on the p well.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

First Embodiment

Figure 1:
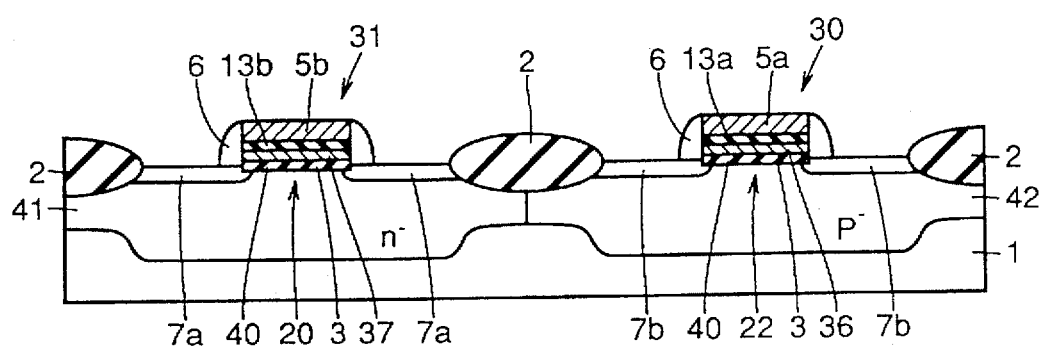
FIG. 1 is a cross section showing a complementary MOS field effect transistor in accordance with a first embodiment of the present invention.

FIG. 1 is a cross section showing a complementary MOS field effect transistor (MOSFET) having a dual gate structure in accordance with a first embodiment of the present invention.

Referring to FIG. 1, an n well 41 and a p well 42 are formed at a main surface of a silicon substrate 1. An n channel MOSFET 22 having a first gate electrode 30 is formed in p well 42. A p channel MOSFET 20 having a second gate electrode 31 is formed in n well 41.

First gate electrode 30 includes a first n-type impurity-implanted polycrystalline silicon film 36 formed on p well 42 with a gate insulating film 3 therebetween; a first silicon oxide film 13a formed on first polycrystalline silicon film 36; and a tungsten silicide film 5a formed on first silicon oxide film 13a. First silicon oxide film 13a have a sufficiently small thickness so that a potential can be transmitted from tungsten silicide film 5a to polycrystalline silicon film 36 by means of a tunnel effect. A preferred thickness of silicon oxide film 13a is at most 30 Å.

Second gate electrode 31 includes a second p-type impurity-implanted polycrystalline silicon film 37 formed on n well 41 with gate insulating film 3 therebetween; a second silicon oxide film 13b formed on second polycrystalline silicon film 37; and a tungsten silicide film 5b formed on second silicon oxide film 13b and serving as a conductive film. Second silicon oxide film 13b has a sufficiently small thickness so that a potential can be transmitted from tungsten silicide film 5b to second polycrystalline silicon film 37 by means of a tunnel effect. A preferred thickness of second polycrystalline silicon film 37 is at most 30 Å.

At a main surface of p well 42, n-type source/drain regions 7b are formed on both sides of first gate electrode 30.

At a main surface of n well 41, p-type source/drain regions 7a are formed on both sides of second gate electrode 31.

Diffusion of dopants such as phosphorus, arsenic and boron is much less in first and second silicon oxide films 13a and 13b than in polycrystalline silicon films 36 and 37. Therefore, diffusion of dopants in polycrystalline silicon films 36 and 37 into tungsten silicide films 5a and 5b can be suppressed, respectively. In addition, since silicon oxide films 13a and 13b are extremely thin, electrons flow as tunnel current at the time of voltage application, and there is little voltage drop, so that a potential can be transmitted from tungsten silicide films 5a and 5b to polycrystalline silicon films 36 and 37, respectively. Consequently, increase in a threshold voltage and depletion of a gate electrode can be suppressed, resulting in a CMOS field effect transistor having high driving ability. In addition, as will be described below, diffusion of dopants between polycrystalline silicon films 36 and 37 can be suppressed.

Although a silicon oxide film is shown as an example of a barrier film in the first embodiment described above, the barrier film may be any film so long as it has a sufficiently small thickness so that a potential can be transmitted respectively from tungsten silicide films 5a and 5b to polycrystalline silicon films 36 and 37 by means of a tunnel effect. A silicon nitride film may be used, for example. In this case, it is preferable for a silicon nitride film to have a thickness of at most 30 Å.

In addition, a tungsten silicide film is shown as an example of a conductive film in the first embodiment described above, the conductive film may be formed of metal or metal silicide other than that.

Furthermore, a polycrystalline silicon film is shown as an example of a non-monocrystalline silicon film in the first embodiment described above, the present invention is not limited to this.

Second Embodiment

Figure 2:
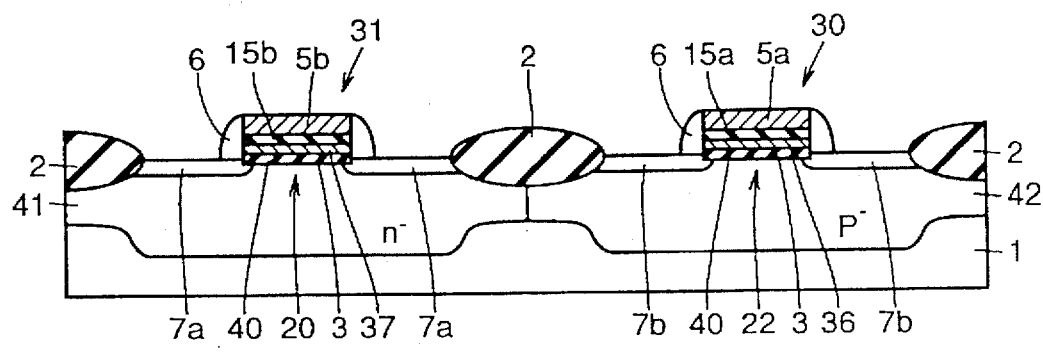
FIG. 2 is a cross section showing a complementary MOS field effect transistor in accordance with a second embodiment of the present invention.

FIG. 2 is a cross section showing a complementary MOS field effect transistor in accordance with a second embodiment of the present invention. Since a CMOS in accordance with the second embodiment is the same as that shown in FIG. 1 except the point which will be described below, a like or corresponding portion is indicated by a like reference, and description thereof will not be repeated.

The CMOS shown in FIG. 2 is different from that shown in FIG. 1 in that a Co silicide film is used as a barrier film. Co silicide films 15a and 15b are formed by forming a Co film between tungsten silicide films 5a and 5b and polycrystalline silicon films 36 and 37, respectively, and then heat treating the Co film. Since Co silicide films 15a and 15b formed by a heat treatment method have higher density than a Co silicide film formed by a sputtering method, diffusion of dopants in polycrystalline silicon films 36 and 37 into tungsten silicide films 5a and 5b can be suppressed, respectively. Accordingly, increase in a threshold voltage and depletion of a gate electrode can be suppressed, resulting in implementation of a CMOS field effect transistor having high driving ability.

Although a Co silicide film is shown as an example of a silicide film in the present embodiment, the present invention is not limited to this, and a silicide film obtained by reacting Ni, Pt and Ta with polycrystalline silicon may be used.

Third Embodiment

Figure 3:
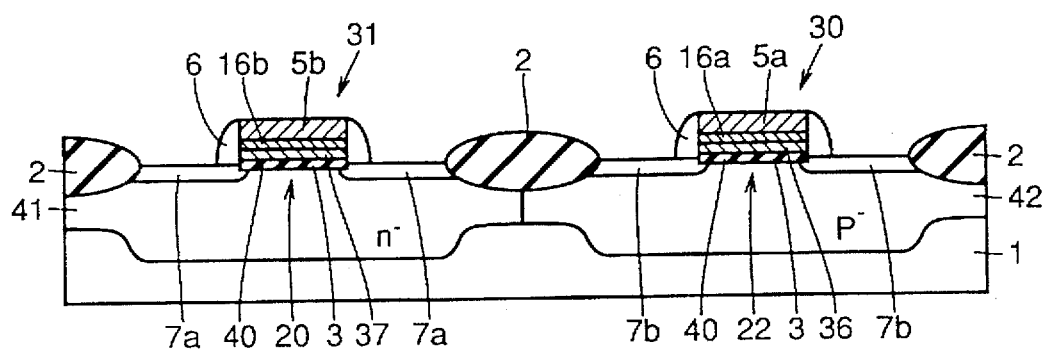
FIG. 3 is a cross section showing a complementary MOS field effect transistor in accordance with a third embodiment of the present invention.

FIG. 3 is a cross section showing a CMOS in accordance with a third embodiment of the present invention. Since the CMOS shown in FIG. 3 is the same as that shown in FIG. 1 except the point which will be described below, a like or corresponding portion is indicated by a like reference and description thereof will not be repeated.

The CMOS shown in FIG. 3 is different from that shown in FIG. 1 in that titanium nitride films 16a and 16b are used as a barrier film.

Titanium nitride films 16a and 16b can suppress diffusion of dopants in polycrystalline silicon films 36 and 37 into tungsten silicide films 5a and 5b, respectively. Accordingly, increase in a threshold voltage and depletion of a gate electrode can be suppressed, resulting in implementation of a CMOS field effect transistor having high driving ability.

In addition, similar effects can be obtained by using nitride films of W, Mo and Ta instead of a titanium nitride film.

Fourth Embodiment

Figure 4:
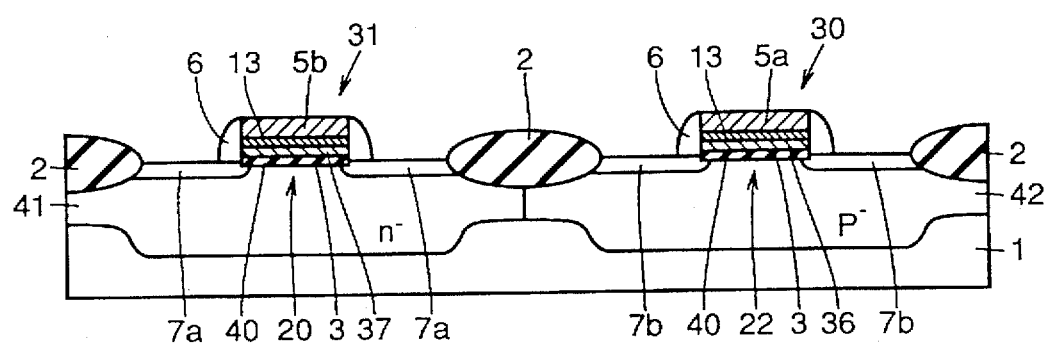
FIG. 4 is a cross section showing a complementary MOS field effect transistor in accordance with a fourth embodiment of the present invention.

FIG. 4 is a cross section showing a CMOSFET in accordance with a fourth embodiment of the present invention. Since the CMOS shown in FIG. 4 is the same as that shown in FIG. 3 except the point which will be described below, a like or corresponding portion is indicated by a like reference and description thereof will not be repeated.

The CMOS shown in FIG. 4 is different from that shown in FIG. 3 in that nitrogen is implanted into polycrystalline silicon films 36 and 37 in addition to dopants such as phosphorus and arsenic. It is preferable to implant nitrogen of $10^{18}$–$10^{20}$ atoms/cm$^3$.

Nitrogen contained in polycrystalline silicon films 36 and 37 is more likely to diffuse than dopants such as boron, phosphorus and arsenic, and suppresses diffusion of dopants. Therefore, diffusion of dopants from polycrystalline silicon films 36 and 37 into tungsten silicide films 5a and 5b can be suppressed. Accordingly, increase in a threshold voltage and depletion of a gate electrode can be suppressed, resulting in implementation of a CMOSFET having high driving ability.

Fifth Embodiment

FIGS. 5 to 12 are cross sections sequentially showing a semiconductor device in steps of a manufacturing method of the CMOSFET shown in FIG. 1, respectively.

Figure 5:
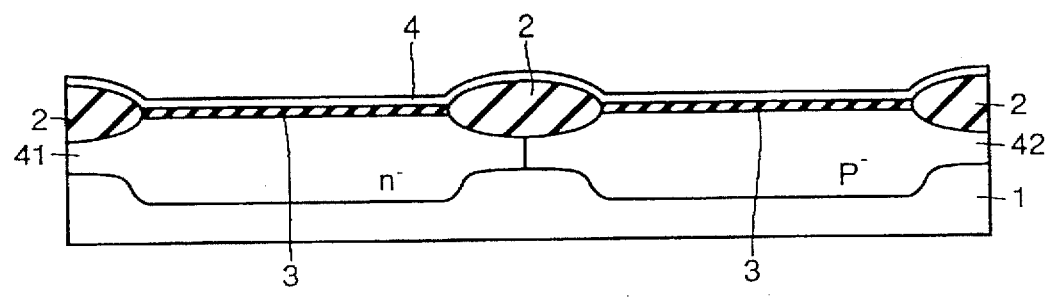
FIGS. 5 to 12 are cross sections respectively showing semiconductor device in first to eighth steps of a manufacturing method in accordance with a fifth embodiment of the present invention.

Referring to FIG. 5, an element isolation oxide film 2 is formed at a main surface of a silicon substrate 1 by an LOCOS (LOCal Oxidation of Silicon) method. A gate oxide film 3 having a thickness of 10–200 Å is formed at the main surface of silicon substrate 1 by heat oxidation, and a polycrystalline silicon film 4 having a thickness of 100–2000 Å is formed thereon by a CVD (Chemical Vapor Deposition) method.

Figure 6:
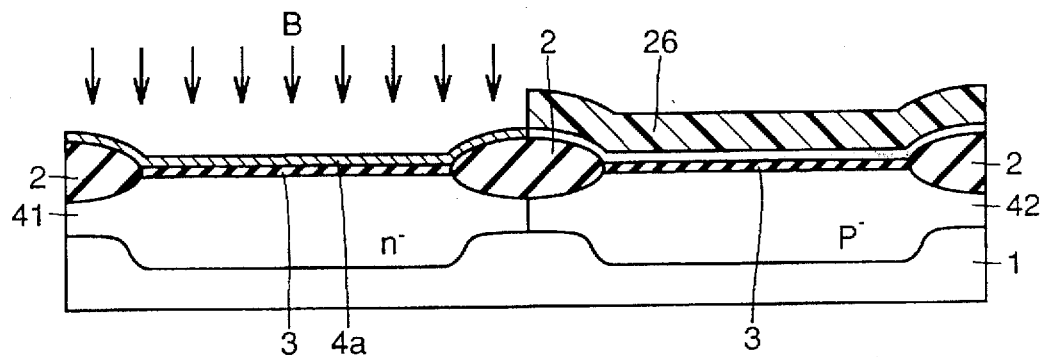

Referring to FIG. 6, a resist film 26 which covers polycrystalline silicon film 4 except a region where a p channel MOSFET is to be formed is formed on silicon substrate 1. Boron ions are implanted into polycrystalline silicon film 4 using resist film 26 as a mask. Resist film 26 is then removed.

Figure 7:
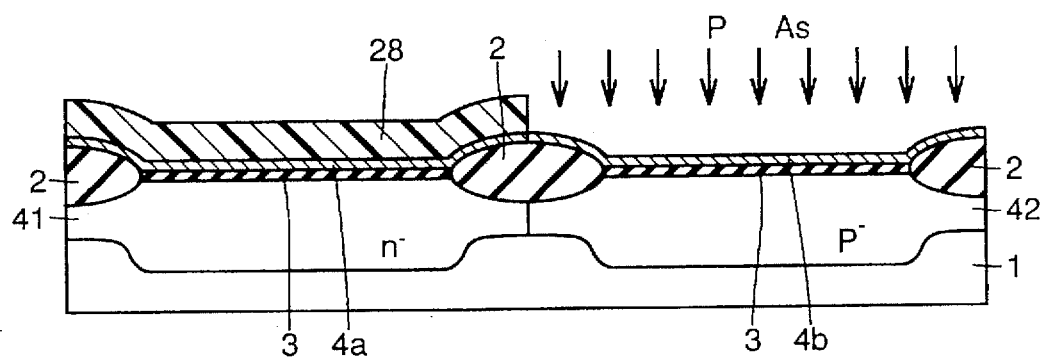

Referring to FIG. 7, a resist film 28 which covers polycrystalline silicon film 4 except a region where an n channel MOSFET is to be formed is formed on silicon substrate 1. Arsenic ions are implanted into polycrystalline silicon film 4 using resist film 28 as a mask. Resist film 28 is then removed.

Figure 8:
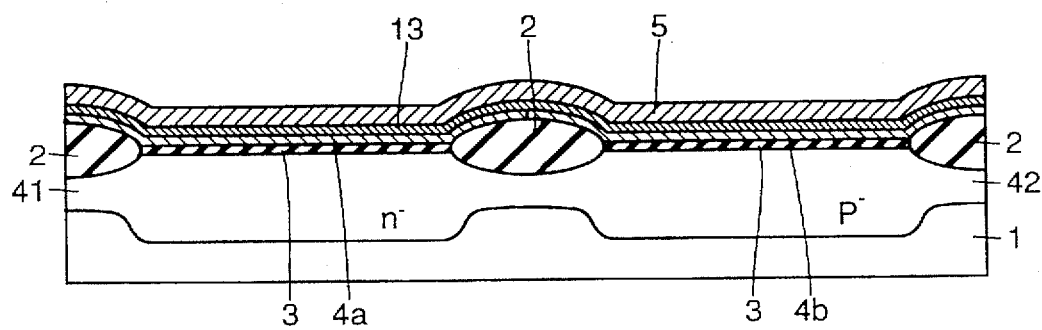

Referring to FIG. 8, a silicon oxide film 13 having a thickness of at most 30 Å which can utilize a tunnel effect is deposited on polycrystalline silicon film 4 by the CVD method. A tungsten silicide film 5 having a thickness of 100–2000 Å is formed on silicon oxide film 13 by the sputtering method.

Figure 9:
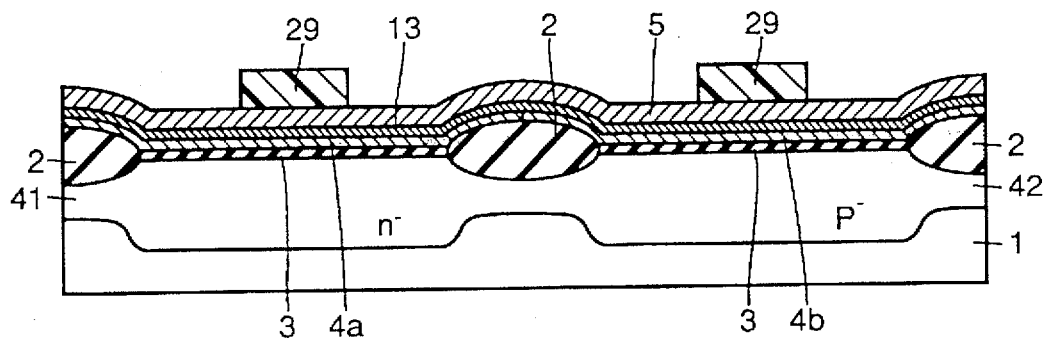

Referring to FIG. 9, a resist film 29 is formed on each of the portions where a first gate electrode of an n channel MOSFET and a second gate electrode of a p channel MOSFET are to be formed, respectively, on tungsten silicide film 5.

Figure 10:
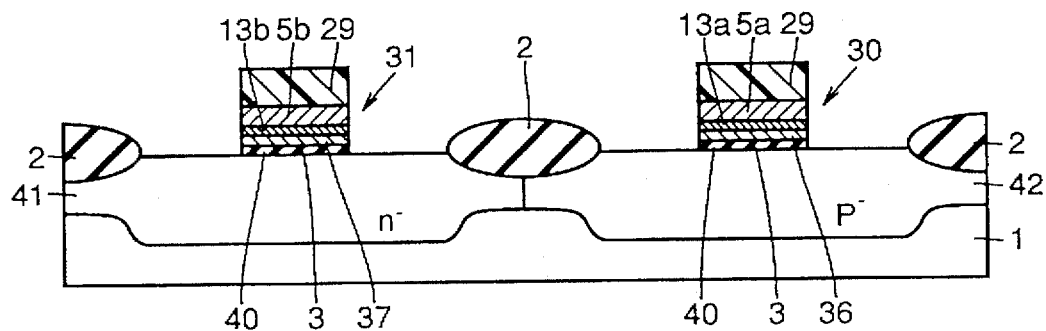
Figure 11:
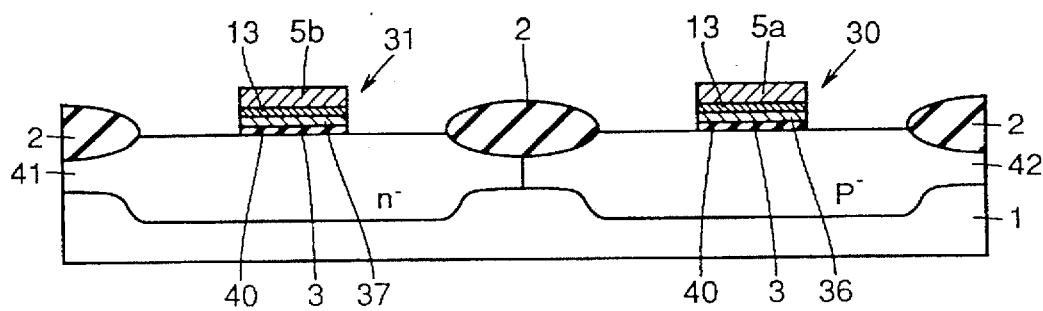

Referring to FIGS. 9 and 10, tungsten silicide film 5, silicon oxide film 13, polycrystalline silicon film 4 and gate insulating film 3 are selectively etched using resist film 29 as a mask. Referring to FIGS. 10 and 11, resist film 29 is removed, whereby first gate electrode 30 and second gate electrode 31 are formed.

Figure 12:
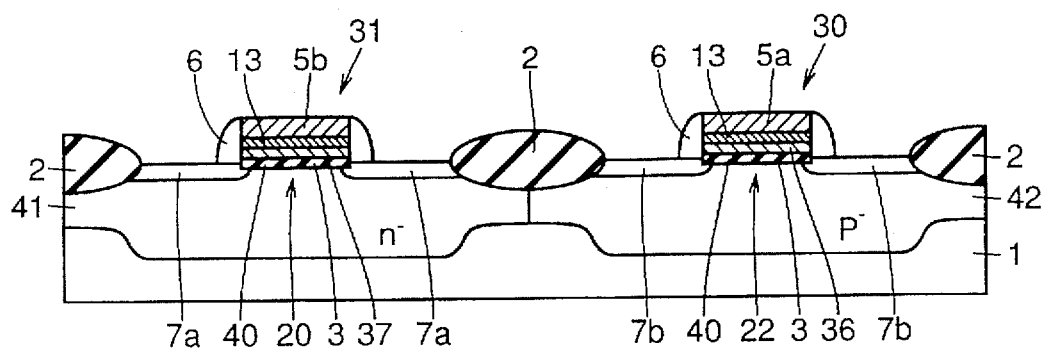

Referring to FIG. 12, boron ions are implanted into a region where a p channel MOSFET is to be formed by means of techniques of photolithography and ion implantation, so that a p-type LDD source/drain region 7a is formed. Similarly, ions of P, Sb and arsenic are implanted into a region where an n channel MOSFET is to be formed by means of techniques of photolithography and ion implantation, so that an n-type LDD source/drain region 7b is formed (conditions of LDD layer formation: 1–50 keV and $1 \times 10^{12}$–$4 \times 10^{15}$ atoms/cm$^2$; conditions of source/drain layer formation: 10–100 keV, $1 \times 10^{13}$–$4 \times 10^{16}$ atoms/cm$^2$, and heat treatment at 500°–1000° C. for 10–360 minutes). During LDD formation, a side wall spacer 6 is formed in a usual way. Finally, a dual gate CMOSFET is completed by heat treatment.

Referring to FIG. 12, diffusion of dopants such as phosphorus, arsenic and boron in silicon oxide film 13 is much less than that in polycrystalline silicon film 4.

In addition, a silicon oxide film formed by the CVD method is generally more porous and has a poorer insulation property than an oxide film formed by thermal oxidation. Based on these properties, a device which can surely transmit a voltage applied to tungsten silicide film 5 to polycrystalline silicon film 4 can be obtained. Furthermore, since silicon oxide film 13 between tungsten silicide film 5 and polycrystalline silicon film 4 is extremely thin, electrons flow as tunnel current at the time of voltage application, and there is little voltage drop, so that a potential can be transmitted from tungsten silicide film 5 to polycrystalline silicon film 4. As a result, increase in a threshold voltage and depletion of a gate electrode can be suppressed, resulting in implementation of CMOSFET having high driving ability. Furthermore, referring to FIG. 8, since silicon oxide film 13 is provided, diffusion of dopants between polycrystalline silicon films 4a and 4b can be suppressed.

Although silicon oxide film 13 is formed by the CVD method in the present embodiment, silicon oxide film 13 may be formed by thermal oxidation of a surface of polycrystalline film 4. Furthermore, silicon oxide film 13 may be formed by soaking the surface of the polycrystalline silicon film in hydrogen peroxide solution for 2 to 100 minutes.

Sixth Embodiment

The present embodiment relates a manufacturing method of a CMOS having a silicon nitride film as a barrier film.

Figure 13:
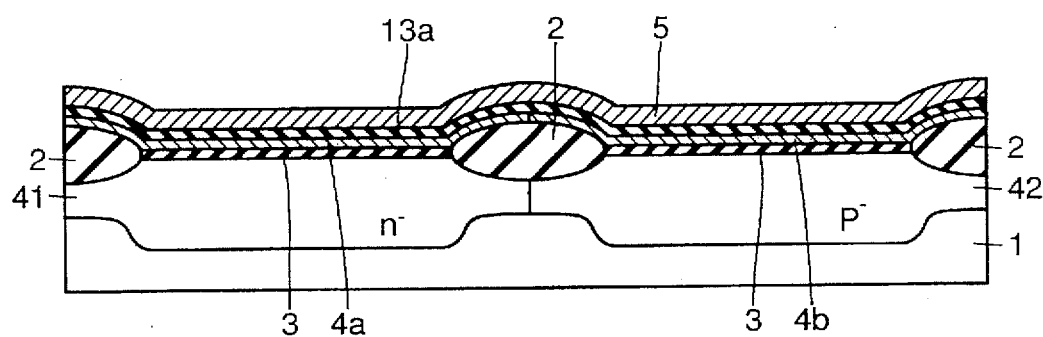
FIG. 13 is a cross section showing a semiconductor device in a step of a main part of a manufacturing method in accordance with a sixth embodiment of the present invention.

First, processing shown in FIGS. 5 to 7 is performed as in the case of the first embodiment. Then, referring to FIG. 13, a silicon nitride film 13a having a thickness of at most 30 Å which can utilize a tunnel effect is deposited on a polycrystalline silicon film 4 by the CVD method. Then, a tungsten silicide film 5 having a thickness of 100–2000 Å is formed by the sputtering method. Then, processing shown in FIGS. 9 to 12 is performed as in the case of the first embodiment. Thus, a CMOS is completed.

Diffusion of dopants such as phosphorus, arsenic, and boron in silicon nitride film 13a is much less than that in polycrystalline silicon film 4. In addition, silicon nitride film 13a formed by the CVD method is generally more porous and has a poorer insulation property than an nitride film formed by heat treatment in a nitrogen atmosphere.

Therefore, a CMOS which can surely transmit voltage applied to tungsten silicide film 5 to polycrystalline silicon film 4 even if silicon nitride film 13a exits can be obtained. In addition, diffusion of dopants in polycrystalline silicon film 4 into tungsten silicide film 5 can be suppressed. Since silicon nitride film 13a is extremely thin, electrons flow as tunnel current at the time of voltage application and there is little voltage drop, so that a CMOS which can transmit a potential can be obtained. Furthermore, referring to FIG. 13, diffusion of dopants between polycrystalline silicon film 4a and polycrystalline silicon film 4b can be suppressed as in the case of the first embodiment.

Although silicon nitride film 13a is formed by the CVD method in the present embodiment, the present invention is not limited to this. In other words, after polycrystalline silicon film 4 is formed, silicon nitride film 13a having a thickness of at most 30 Å which can utilize a tunnel effect may be formed by performing heat treatment by an RTA (Rapid Thermal Annealing) method at 850°–1200° C. for 10–60 seconds in an NH$_3$ atmosphere.

Seventh Embodiment

The present embodiment relates to a manufacturing method of a CMOS having a Co silicide film as a barrier film.

First, processing shown in FIGS. 5 to 7 is performed as in the case of the first embodiment.

Figure 14:
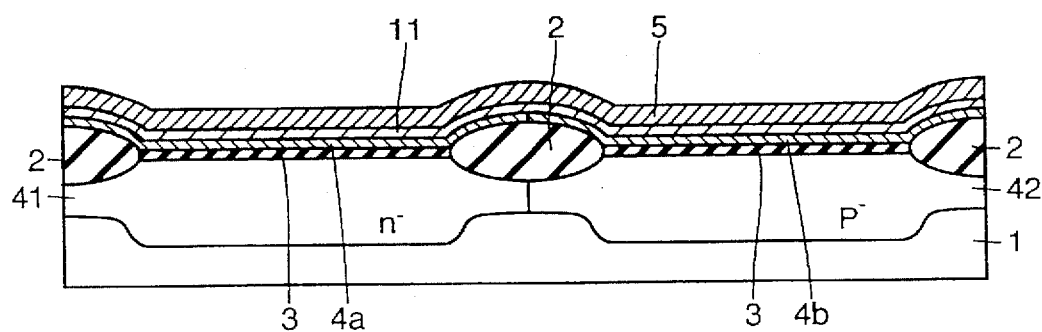
FIGS. 14 and 15 are cross sections respectively showing a semiconductor device in first and second steps of a main part of a manufacturing method in accordance with a seventh embodiment of the present invention.

Then, referring to FIG. 14, a Co film 11 having a thickness of 10–150 Å is deposited on a polycrystalline silicon film 4 by the sputtering method. A tungsten silicide film 5 having a thickness of 100–2000 Å is formed by the sputtering method. Then, referring to FIG. 15, Co film 11 and polycrystalline silicon film 4 are reacted with each other by performing heat treatment by the RTA method at 500°–900° C. for 10–60 seconds to form a Co silicide film 15. Then, processing shown in FIGS. 9 to 13 described in the first embodiment is performed, whereby a CMOS is completed.

Since Co silicide film 15 has high density, diffusion of dopants in polycrystalline silicon film 4 into tungsten silicide film 5 is suppressed. Consequently, a CMOS which can suppress diffusion of dopants in the polycrystalline silicon film into tungsten silicide film 5 can be obtained.

Figure 15:
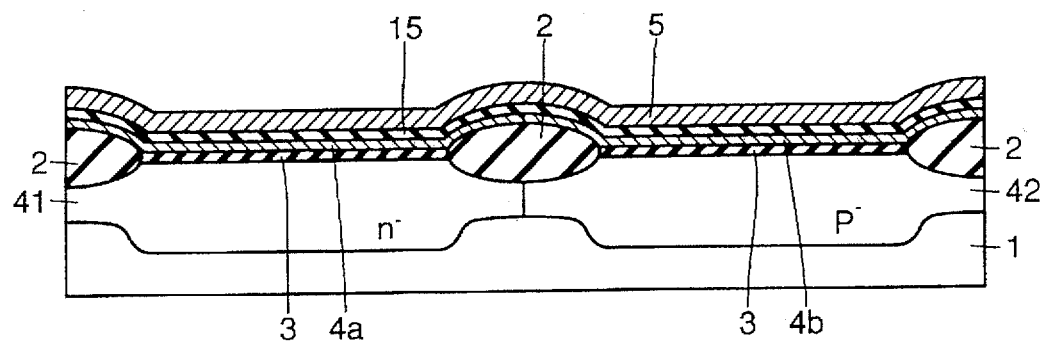

In addition, referring to FIG. 15, diffusion of dopants between polycrystalline silicon film 4a and polycrystalline silicon film 4b can be suppressed.

Although Co is used as a metal film for formation of silicide in the present embodiment, the present invention is not limited to this, and similar effects can be obtained with Ni, Pt and Ta.

Although a Co film is subjected to the RTA method to form Co silicide film 15 in the present embodiment, the present invention is not limited to this. In other words, it is also possible that Co film 11 is deposited on polycrystalline silicon film 4, and then, Co film 11 and polycrystalline silicon film 4 are reacted with each other at the same time that heat treatment for formation of source/drain regions shown in FIG. 12 is performed, so that Co silicide film 15 is formed.

Eighth Embodiment

The present embodiment relates to a manufacturing method of a CMOS having a Ti-nitride film as a barrier film.

Figure 16:
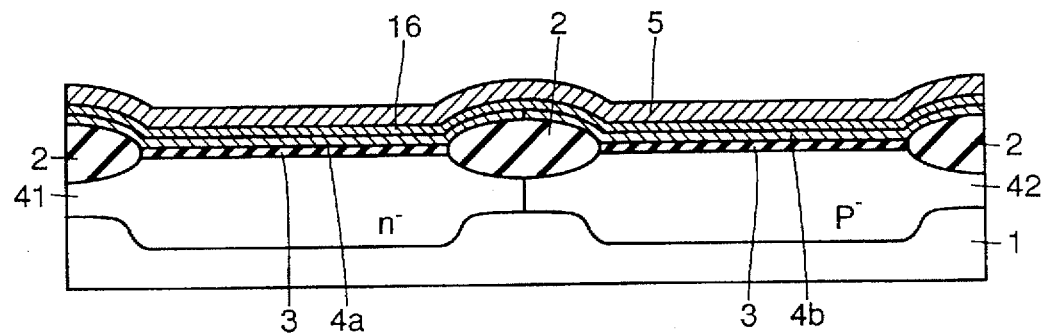
FIG. 16 is a cross section showing a semiconductor device in a step of a main part of a manufacturing method in accordance with an eighth embodiment of the present invention.

First, processing shown in FIGS. 5 to 7 is performed as in the case of the first embodiment. Then, referring to FIG. 16, a Ti-nitride film 16 having a thickness of 10–150 Å is deposited on a polycrystalline silicon film 4 by the sputtering method. A tungsten silicide film 5 having a thickness of 100–2000 Å is formed by the sputtering method. Then, processing shown in FIGS. 9 to 12 is performed, whereby a CMOSFET is completed.

Since Ti-nitride film 16 has high density, diffusion of dopants in polycrystalline silicon film 4 into tungsten silicide film 5 is suppressed. Consequently, diffusion of dopants in polycrystalline silicon film 4 into tungsten silicide film 5 can be suppressed. As a result, increase in a threshold voltage and depletion of a gate electrode can be suppressed, resulting in implementation of a CMOSFET having high driving ability. In addition, referring to FIG. 16, diffusion of dopants between a polycrystalline silicon film 4a and a polycrystalline silicon film 4b can be suppressed.

Although Ti is used as a metal film for formation of nitride in the present embodiment, the present invention is not limited to this, and similar effects can be obtained with W, Mo and Ta.

Ninth Embodiment

The present embodiment relates to an another method of forming a Ti-nitride film 16.

First, processing shown in FIGS. 5 to 7 is performed as in the case of the first embodiment.

Figure 17:
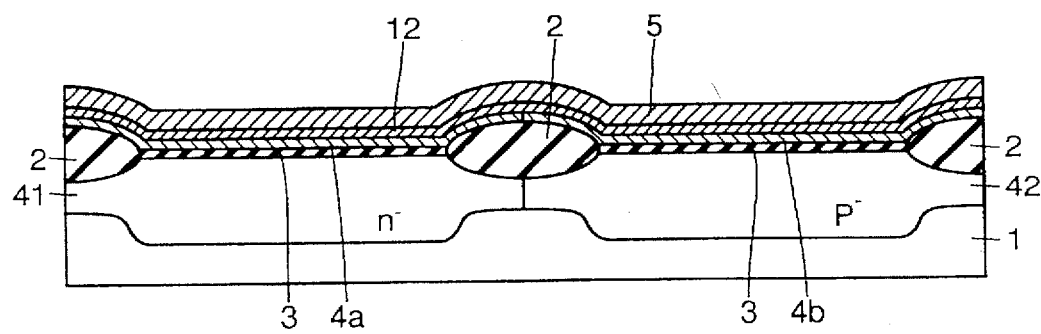
FIGS. 17 and 18 are cross sections respectively showing a semiconductor device in first and second steps of a main part of a manufacturing method in accordance with a ninth embodiment of the present invention.
Figure 18:
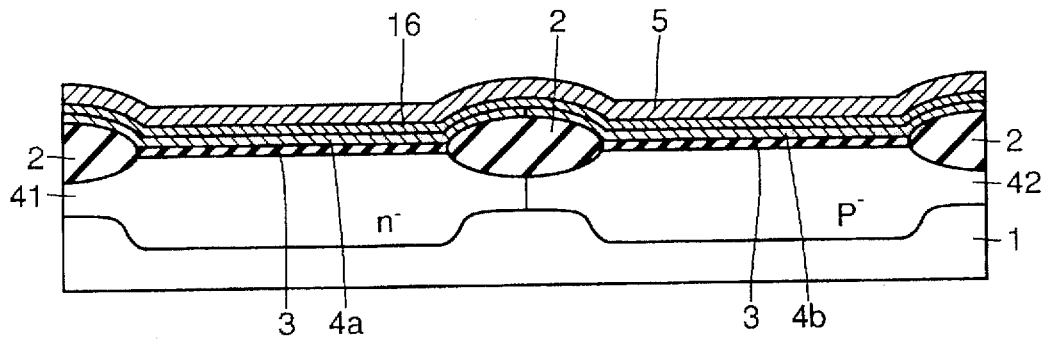

Referring Go FIG. 17, a Ti film 12 having a thickness of 10–150 Å is deposited on a polycrystalline silicon film 4 by the sputtering method. A tungsten silicide film 5 having a thickness of 100–2000 Å is formed by the sputtering method. Then, referring to FIG. 18, Ti film 12 and polycrystalline silicon film 4 are reacted with each other by performing heat treatment by the RTA method at 500°–900° C. for 10–60 seconds in a nitrogen atmosphere to form a Ti-nitride film 16.

Then, processing shown in FIGS. 9 to 12 is performed as in the case of the first embodiment, whereby CMOS is completed.

Tenth Embodiment

The present embodiment relates to a manufacturing method of a CMOS having a gate electrode which includes a nitrogen-doped polycrystalline silicon film.

Figure 19:
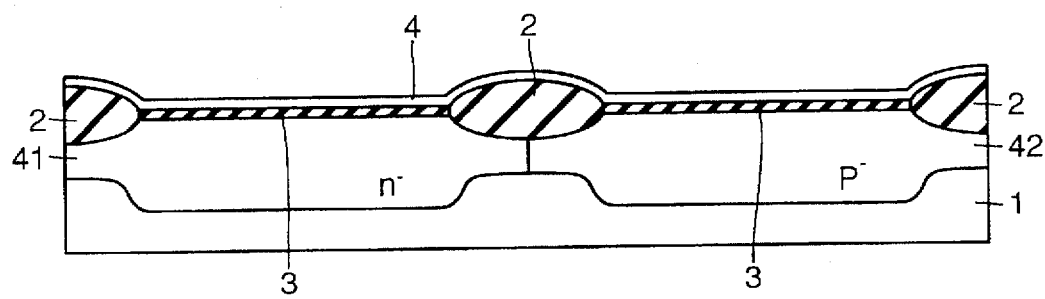
FIGS. 19 to 23 are cross sections respectively showing a semiconductor device in first to fifth steps of a manufacturing method in accordance with a tenth embodiment of the present invention.

Referring to FIG. 19, an element isolation oxide film 2 is formed at a main surface of a silicon substrate 1 by the LOCOS method, and a gate insulating film 3 having a thickness of 10–200 Å is then formed by the thermal oxidation method. Then, a polycrystalline silicon film 4 having a thickness of 100–1000 Å is formed by the CVD method.

Figure 20:
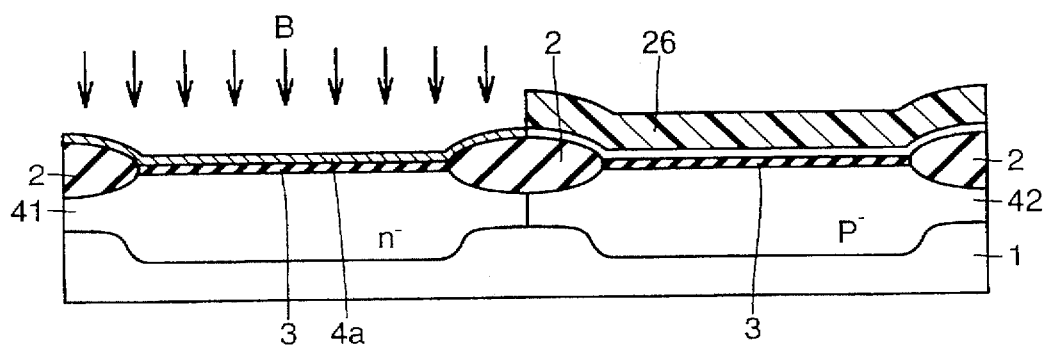
Figure 21:
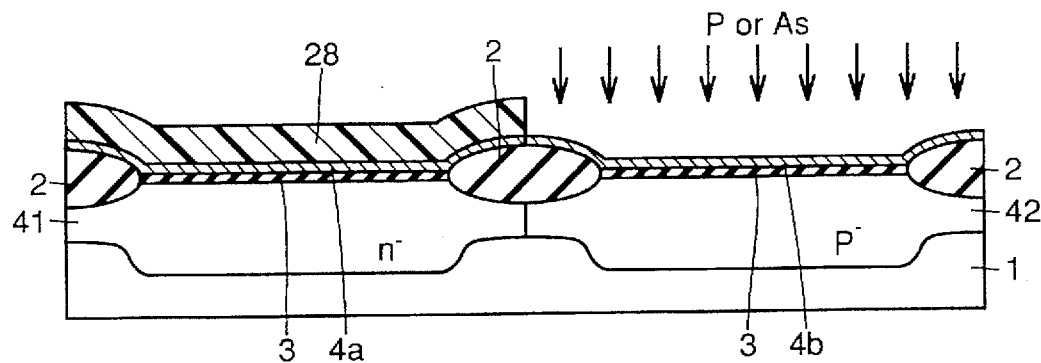
Figure 22:
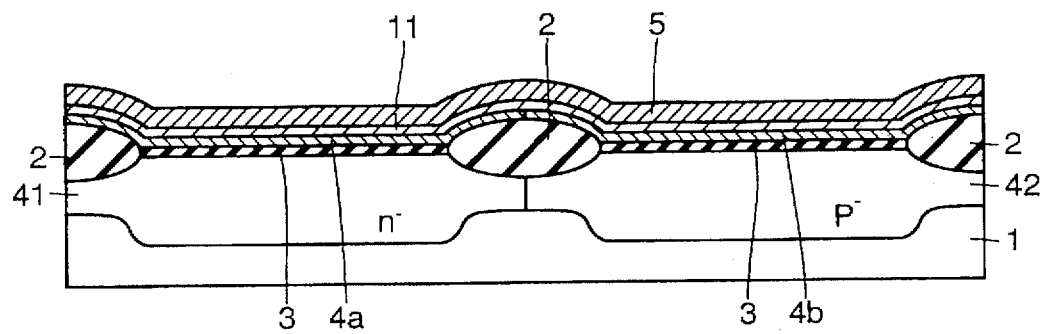

Then, a nitrogen-doped polycrystalline silicon film 4 is formed by ion implantation of nitrogen of $1 \times 10^{12}$–$4 \times 10^{18}$ atoms/cm$^3$ into polycrystalline silicon film 4 with 30 keV. Then, processing shown in FIG. 20 corresponding to FIG. 6 and processing shown in FIG. 21 corresponding to FIG. 7 are performed. Referring to FIG. 22, a Co film 11 having a thickness of 10–100 Å is deposited on polycrystalline silicon film 4 by the sputtering method, and a tungsten silicide film 5 having a thickness of 100–1000 Å is then formed by the sputtering method.

Figure 23:
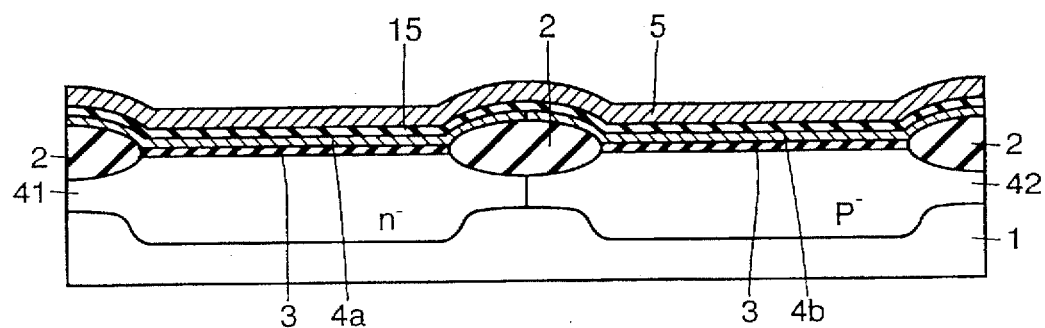
Figure 24:
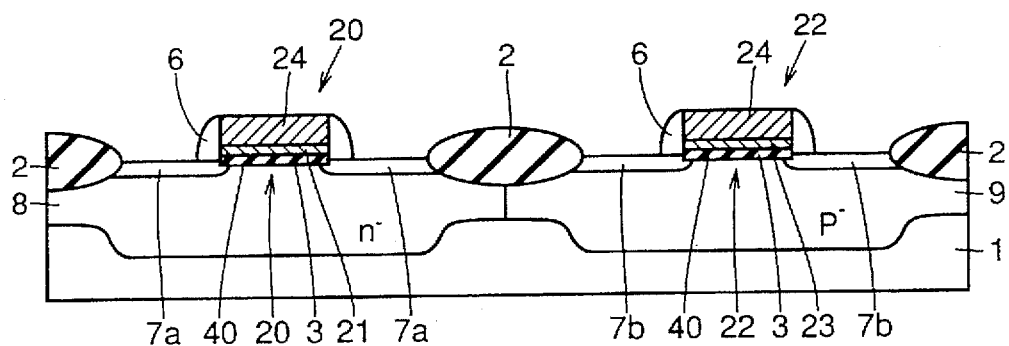
FIG. 24 is a cross section showing a conventional CMOSFET having a dual gate electrode structure.
Figure 25:
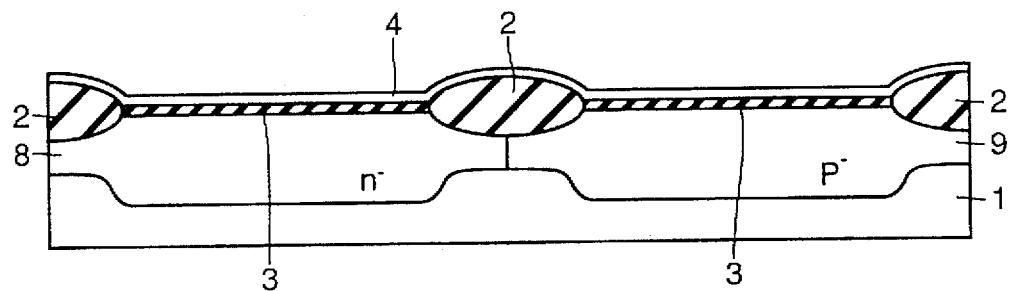
FIGS. 25 to 32 are cross sections respectively showing a semiconductor device in first to eighth steps of a manufacturing method of a conventional CMOSFET having a dual gate electrode structure.
Figure 26:
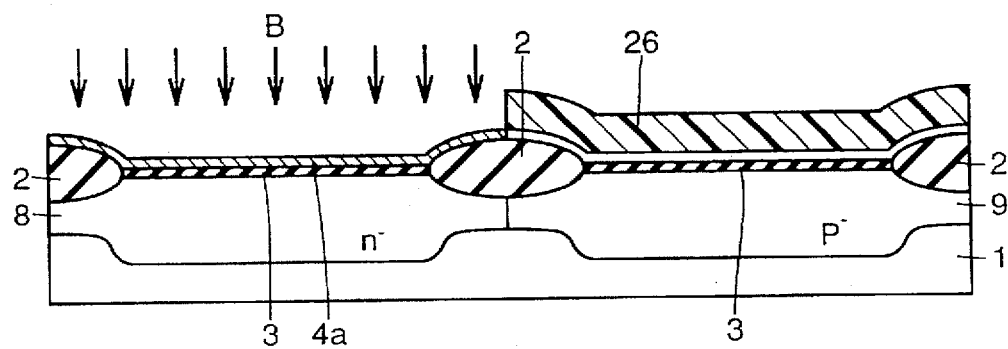
Figure 27:
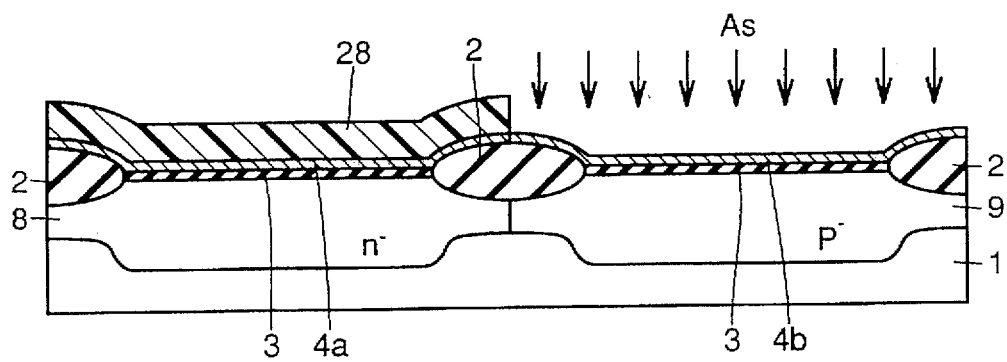
Figure 28:
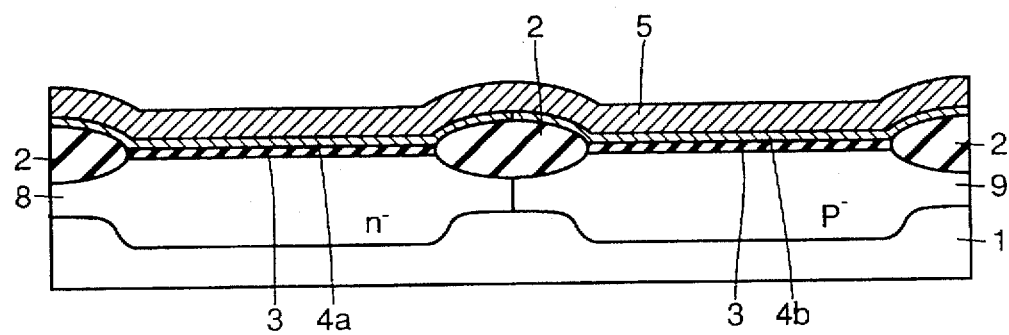
Figure 29:
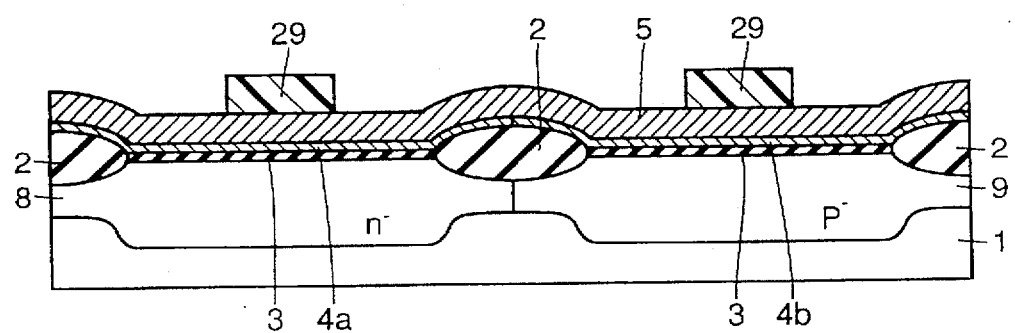
Figure 30:
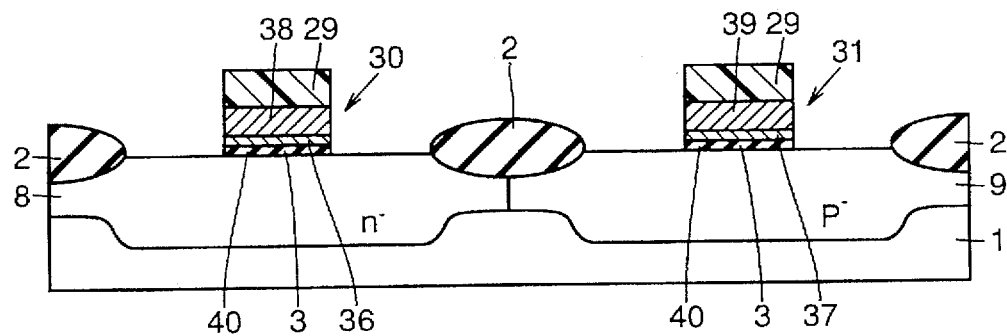
Figure 31:
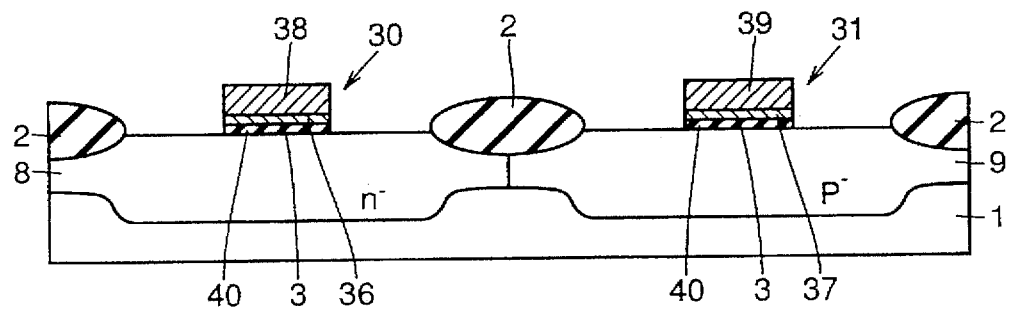
Figure 32:
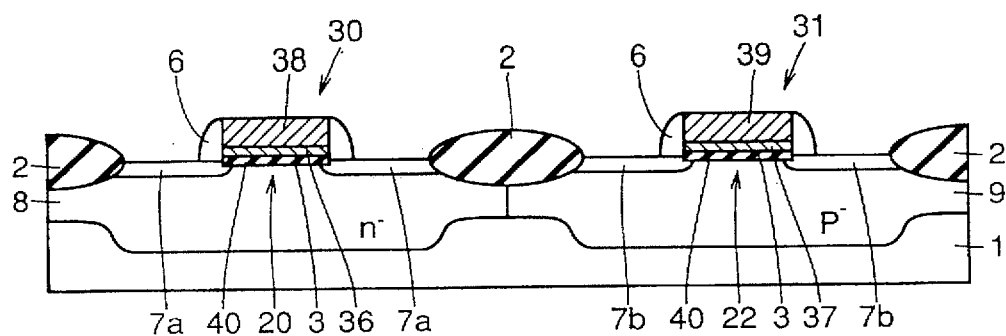

Referring to FIGS. 22 and 23, Co film 11 and polycrystalline silicon film 4 are reacted with each other by performing heat treatment by the RTA method at 500°–900° C. for 10–60 seconds to change Co film 11 into Co silicide film 15. Then, processing shown in FIGS. 9 to 12 is performed as in the case of the first embodiment, whereby a CMOS is completed.

According to the present embodiment, nitrogen contained in polycrystalline silicon film 4 is more likely to diffuse than dopants such as boron, phosphorus and arsenic, and suppresses diffusion of these dopants, and therefore, diffusion of dopants into tungsten silicide film 5 can be suppressed. Accordingly, increase in a threshold voltage and depletion of a gate electrode can be suppressed, resulting in implementation of a CMOSFET having high driving ability. In addition, referring to FIG. 22, diffusion of dopants between a polycrystalline silicon film 4a and a polycrystalline silicon film 4b can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary MOS field effect transistor having a dual gate structure, comprising:

a semiconductor substrate;

an n well and a p well formed in said semiconductor substrate;

an n channel MOSFET formed in said p well and having a first gate electrode; and a p channel MOSFET formed in said n well and having a second gate electrode, wherein said first gate electrode includes a first silicon film which is formed on said p well with a gate insulating film therebetween and to which impurities of a first conductivity type have been implanted, a first silicon oxide film formed on said first silicon film, and a first conductive film of metal or metal silicide formed on said first silicon oxide film, said second gate electrode includes a second silicon film which is formed on said n well with a gate insulating film therebetween and to which impurities of a second conductivity type have been implanted, a second silicon oxide film formed on said second silicon film, and a second conductive film of metal or metal silicide formed on said second silicon oxide film, said first silicon oxide film has a sufficiently small thickness so that a potential can be transmitted from said first conductive film to said first silicon film by means of a tunnel effect, and said second silicon oxide film has a sufficiently small thickness so that a potential can be transmitted from said second conductive film to said second silicon film by means of a tunnel effect, wherein each of said first and second silicon oxide films has a thickness of at most 30 Å.

2. The complementary MOS field effect transistor according to claim 1, wherein each of said first and second silicon films is formed of a non-monocrystalline silicon film.

3. The complementary MOS field effect transistor according to claim 1, wherein nitrogen is implanted into said first and second silicon films.

4. The complementary MOS field effect transistor according to claim 3, wherein a content of said nitrogen is in a range of $10^{18}$ to $10^{20}$ atoms/cm$^3$.

* * * * *